(12) United States Patent
Herner

(10) Patent No.: US 8,187,945 B2
(45) Date of Patent: May 29, 2012

(54) METHOD FOR OBTAINING SMOOTH, CONTINUOUS SILVER FILM

(75) Inventor: Scott Brad Herner, San Jose, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 12/913,719

(22) Filed: Oct. 27, 2010

(65) Prior Publication Data

US 2012/0108030 A1    May 3, 2012

(51) Int. Cl.
*H01L 21/20* (2006.01)
*H01L 21/302* (2006.01)
*H01L 21/461* (2006.01)

(52) U.S. Cl. .................. 438/382; 438/704; 438/706

(58) Field of Classification Search .................. 438/382, 438/704, 706; 257/E29.17
See application file for complete search history.

(56) References Cited

U.S. PATENT DOCUMENTS

| 2004/0194340 A1* | 10/2004 | Kobayashi | 34/630 |
| 2010/0102290 A1* | 4/2010 | Lu et al. | 257/4 |

* cited by examiner

*Primary Examiner* — William M. Brewster
(74) *Attorney, Agent, or Firm* — Ogawa P.C.

(57) ABSTRACT

A method for forming a semiconductor device including a resistive memory cell includes providing a substrate having an upper surface. A first conductive layer is formed over the upper surface of the substrate. An amorphous silicon layer is formed over the first conductive layer. A surface of the amorphous silicon layer is cleaned to remove native oxide formed on the surface of the amorphous silicon layer. A silver layer is deposited over the amorphous silicon layer after removing the native oxide by performing the cleaning step. The resistive memory cell includes the first conductive layer, the amorphous silicon layer, and the second conductive layer. The surface of the amorphous silicon layer is cleaned to prevent silver agglomeration on the native oxide.

16 Claims, 15 Drawing Sheets

METHOD FOR OBTAINING SMOOTH, CONTINUOUS SILVER FILM

CROSS-REFERENCES TO RELATED APPLICATIONS

NOT APPLICABLE

BACKGROUND OF THE INVENTION

The present invention relates to a memory device including resistive memory cells, in particular methods for producing a smooth, continuous silver film on a semiconductor device, in particular on a resistive memory device.

Resistive random-access memories (RRAMs) are a type of resistive memory and have generated significant interest recently as a potential candidate for ultra-high density non-volatile information storage. A typical RRAM device has an insulator layer provided between a pair of electrodes and exhibits electrical pulse-induced hysteretic resistance-switching effects.

The resistance switching has been explained by the formation of conductive filaments inside the insulator due to Joule heating and electrochemical processes in binary oxides (e.g. NiO and $TiO_2$) or redox processes for ionic conductors including oxides, chalcogenides and polymers. The resistance switching has also been explained by field assisted diffusion of ions in $TiO_2$ and amorphous silicon (a-Si) films.

In the case of a-Si structures, electric field-induced diffusion of metal ions into the silicon leads to the formation of conductive filaments that reduce the resistance of the a-Si structure. These filaments remain after a biasing (or program) voltage is removed, thereby giving the device its non-volatile characteristic, and they can be removed by reverse flow of the ions back toward the metal electrode under the motive force of a reverse polarity applied voltage.

Resistive devices formed by an a-Si structure provided between two metal electrodes have been shown to exhibit this controllable resistive characteristic.

BRIEF SUMMARY OF THE INVENTION

The present invention relates to methods for producing a smooth, continuous silver film on a semiconductor device, in particular on a resistive memory device.

In an embodiment, a method for forming a semiconductor device including a resistive memory cell includes providing a substrate having an upper surface. A first conductive layer is formed over the upper surface of the substrate. An amorphous silicon layer is formed over the first conductive layer. A surface of the amorphous silicon layer is cleaned to remove native oxide formed on the surface of the amorphous silicon layer. A silver layer is deposited over the amorphous silicon layer after removing the native oxide by performing the cleaning step. The memory cell includes the first conductive layer, the amorphous silicon layer, and the second conductive layer. The surface of the amorphous silicon layer is cleaned to prevent silver agglomeration on the native oxide.

In an embodiment, the cleaning step includes sputtering using an inert gas or dipping the substrate having the amorphous silicon layer in a solution including hydrogen flouride. The silver layer may be formed to a thickness of no more than 800 angstroms, or no more than 500 angstroms, or no more than 200 angstroms.

In an embodiment, the substrate includes a control circuit formed on or below the surface of the substrate, so that the resistive memory cell is formed over the control circuit, the control circuit being configured to control an operation of the resistive memory cell.

In an embodiment, a method for forming a semiconductor device including a resistive memory cell includes providing a substrate having an upper surface. A first conductive layer is formed over the upper surface of the substrate. An amorphous silicon layer is formed over the first conductive layer. A surface of the amorphous silicon layer is cleaned to remove oxide formed on the surface of the amorphous silicon layer. A silver layer is deposited on the amorphous silicon layer after removing the native oxide by performing the cleaning step, the silver layer being no more than 500 angstroms in thickness. The resistive memory cell includes the first conductive layer, the amorphous silicon layer, and the second conductive layer. The surface of the amorphous silicon layer is cleaned to prevent silver agglomeration on the oxide.

The details of one or more embodiments are set forth in the accompanying drawings and the description below. Other features, objects, and advantages will be apparent from the description and drawings, and from the claims.

BRIEF DESCRIPTION OF THE DRAWINGS

Exemplary embodiments will hereinafter be described in conjunction with the appended drawings, wherein like designations denote like elements, and wherein.

DETAILED DESCRIPTION OF THE INVENTION

The present invention relates to methods for producing a smooth, continuous silver film on a semiconductor device, in particular on a resistive memory device.

Figure 1:
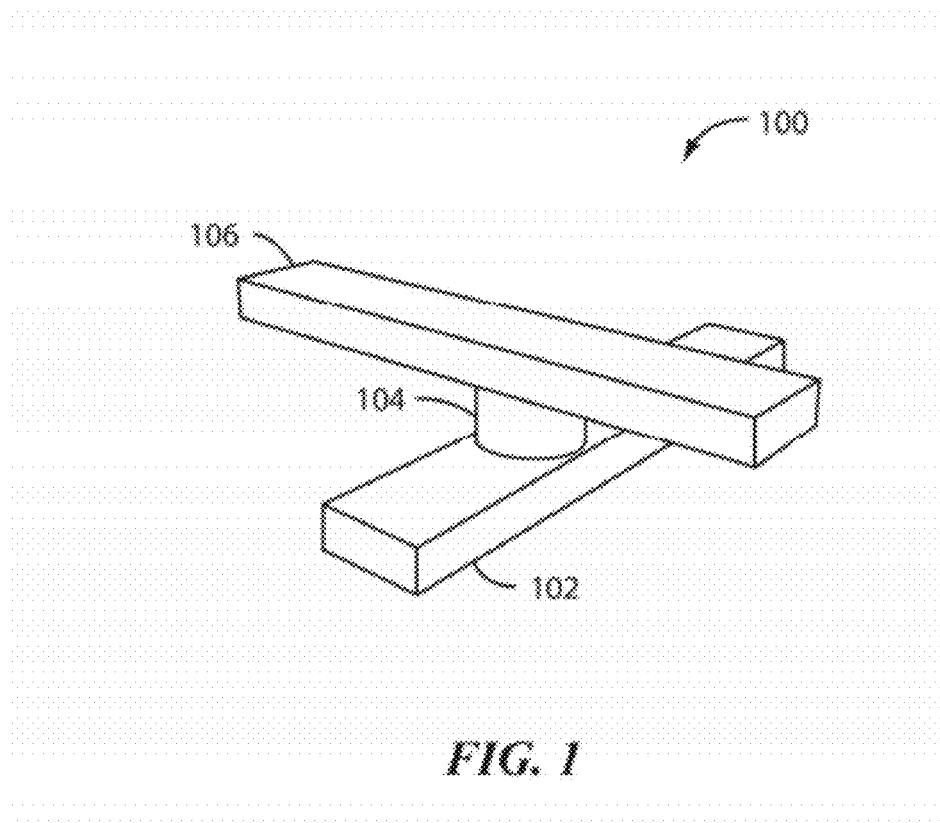
FIG. 1 illustrates a non-volatile memory device including a memory cell that has a bottom electrode, a switching medium, and a top electrode according to an embodiment of the present invention.

FIG. 1 illustrates a memory cell 100 in a non-volatile memory device, e.g., a semiconductor memory chip. The memory cell includes a bottom electrode 102, a switching medium 104, and a top electrode 106 according an embodiment of the present invention. The switching medium 104 exhibits a resistance that can be selectively set to various values, and reset, using appropriate control circuitry. The cell 100 is a two-terminal resistive memory device, e.g., resistive random-access memory (RRAM), in the present embodiment.

The resistive memory cell is a two-terminal memory cell having a switching medium provided between top and bottom electrodes. The resistance of the switching medium can be controlled by applying an electrical signal to the electrodes. The electrical signal may be current-based or voltage-based. As used herein, the term "RRAM" or "resistive memory cell" refers to a memory cell or memory device that uses a switching medium whose resistance can be controlled by applying electrical signal without ferroelectricity, magnetization and phase change of the switching medium.

In the present embodiment, the memory cell 100 is amorphous-silicon-based resistive memory cell and uses amorphous silicon (a-Si) as the switching medium 104. The resistance of the switching medium 104 changes according to formation or retrieval of a conductive filament inside the a-Si switching medium according to a voltage applied. The top electrode 106 is a conductive layer containing silver (Ag) and acts as the source of filament-forming ions in the a-Si structure. Although silver is used in the present embodiment, it will be understood that the top electrode 106 can be formed from various other suitable metals, such as gold (Au), nickel (Ni), aluminum (Al), chromium (Cr), iron (Fe), manganese (Mn), tungsten (W), vanadium (V), and cobalt (Co). The bottom electrode 102 is a boron-doped or other p-type polysilicon electrode that is in contact with a lower end face of the a-Si structure.

Figure 2A:
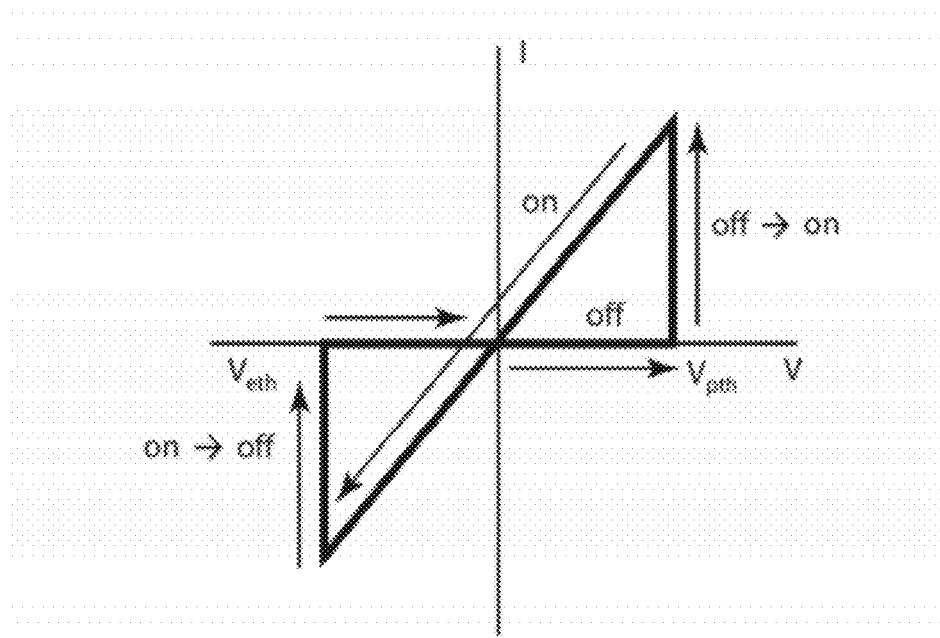
FIG. 2A illustrates resistance switching characteristics of a resistive memory cell according to an embodiment of the present invention.

FIG. 2A illustrates a resistance switching characteristics of the cell 100 according to an embodiment of the present invention. The switching medium 104 displays a bipolar switching mechanism. The resistance of the switching medium 104 changes depending on the polarity and magnitude of the current signal applied to the switching medium 104 via the top and bottom electrodes 106 and 102. The cell 100 is changed into ON-state (low resistance state) when a positive voltage equal to or greater than a program threshold voltage (or program voltage) $V_{pth}$ is applied. In an embodiment, the program voltage ranges between 2 volts to 5 volts depending on the materials used for the switching medium 104 and the top electrode 106. The cell 100 is switched back to OFF-state (high resistance state) when a negative voltage equal to or greater than an erase threshold voltage (or erase voltage) $V_{eth}$ is applied. In an embodiment, the erase voltage ranges from −2 volts to −5 volts. The cell state is not affected if the voltage applied is between two threshold voltages $V_{pth}$ and $V_{eth}$, which enables a low-voltage read process. Once the cell 100 is set to a specific resistance state, the cell 100 retains the information for a certain period (or retention time) without electrical power.

FIG. 2A illustrates non-rectifying switching characteristics of the cell 100 according to an embodiment of the present invention. Electrical current flows from the top electrode 106 to the bottom electrode 102 when the top electrode is applied with a positive potential with respect to the bottom electrode. On the other hand, the current flows in the reverse direction if the top electrode is applied with a negative potential with respect to the bottom electrode.

Figure 2B:
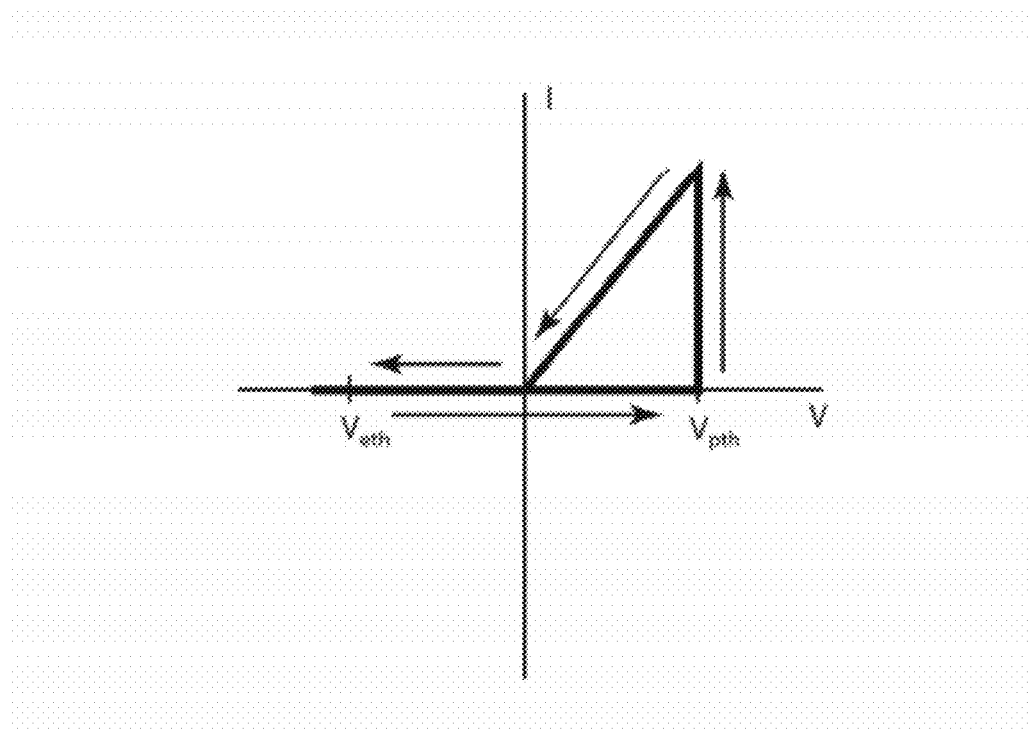
FIG. 2B illustrates resistance switching characteristics of a resistive memory cell according to an embodiment of the present invention.

FIG. 2B, on the other hand, illustrates rectifying switching characteristics of the cell 100 according to another embodiment of the present invention. Electrical current flows from the top electrode 106 to the bottom electrode 102 when the top electrode is applied with a positive potential with respect to the bottom electrode, but the current does not flow in the reverse direction even if the top electrode is applied with a negative potential with respect to the bottom electrode. Under this embodiment, the cell 100 exhibits a diode-like behavior and can be represented with an equivalent circuit including a resistor connected in series with a diode. The cell 100 can be controlled to exhibit either rectifying or non-rectifying characteristics by controlling the amount of current flowing through the cell as will be explained in more detail later.

Figure 3A:
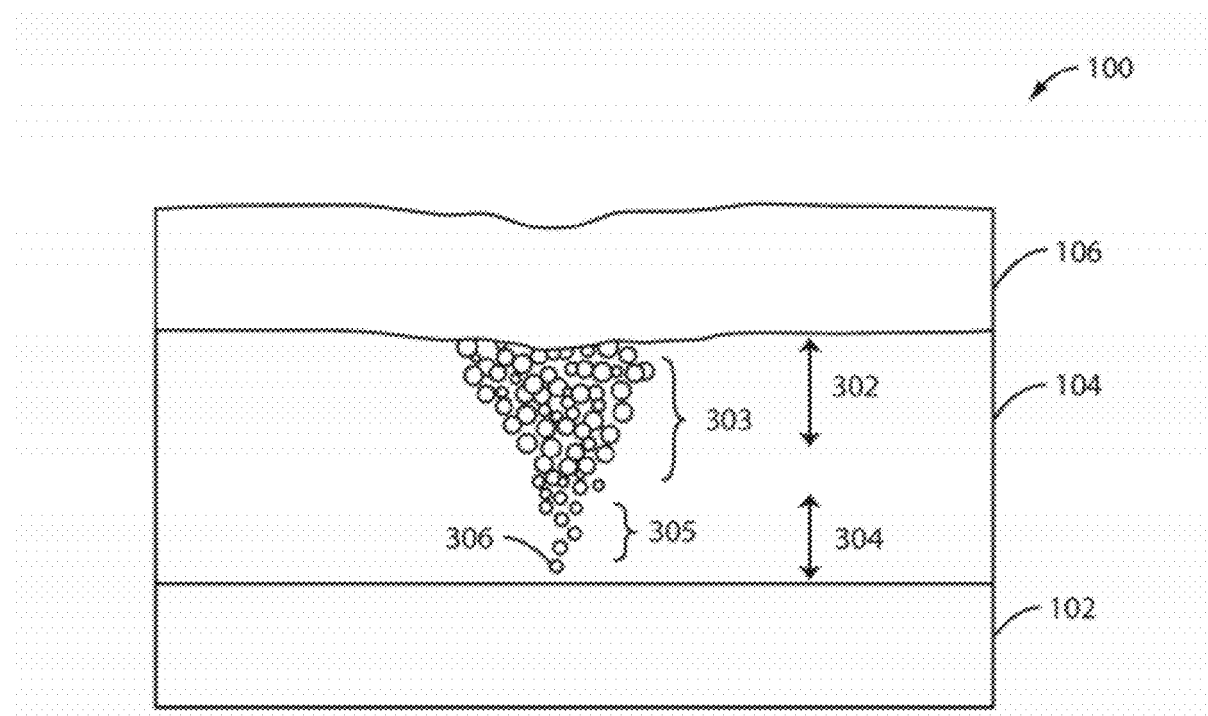
FIG. 3A illustrates a two-terminal memory cell that is placed in an ON state by applying a program voltage $V_{pth}$ to the top electrode.
Figure 3B:
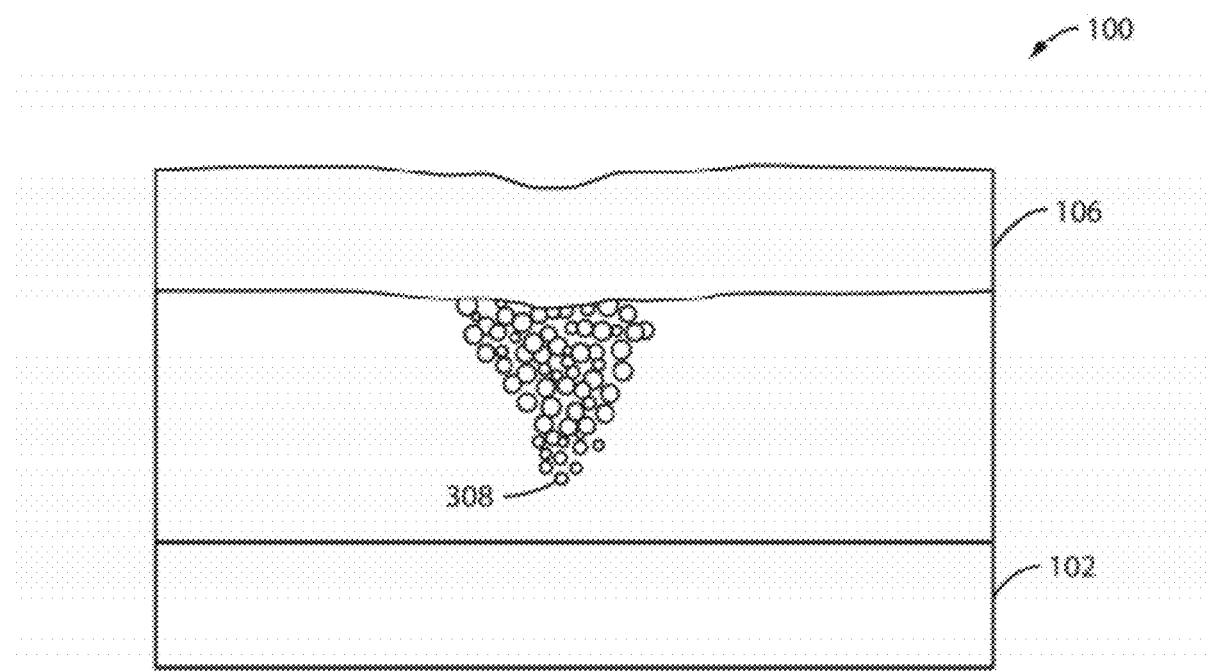
FIG. 3B illustrates a two-terminal memory cell that is placed in an OFF state by applying an erase voltage $V_{eth}$ to the top electrode.

FIGS. 3A and 3B illustrate a switching mechanism of the cell 100 during the ON and OFF states according to an embodiment of the present invention. The switching in the a-Si medium 104 is based on formation and retrieval of a conductive filament or a plurality of filaments in a filament region in the a-Si medium 104 according to the program and the erase voltages applied to the electrodes 102 and 106 of the cell 100.

FIG. 3A illustrates the cell 100 that is placed in the ON state by applying the program voltage $V_{pth}$ to the top electrode 106. The switching medium 104 made of a-Si is provided between the bottom electrode 102 and the top electrode 106. An upper portion of the switching medium 104 includes a metallic region (or conductive path) 302 that extends from the top electrode to about 10 nm above the bottom electrode 102. The metallic region 302 is formed during an electroforming process when a slightly larger voltage than a subsequent switching voltage, e.g., 3~5 V, is applied to the top electrode 106. This large voltage causes the electric field induced diffusion of the metal ions from the top electrode 106 toward the bottom electrode 102, thereby forming a continuous conductive path 303. A lower portion of the switching medium 104 defines a filament region 304 wherein a filament 305 is formed when the program voltage $V_{pth}$ is applied after the electroforming process. The regions 303 and 305 can be also formed together during the electroforming process. The filament 305 comprises a series of metal particles that are trapped in defect sites in a lower portion of the switching medium 104 when the program voltage $V_{pth}$ applied provides sufficient activation energy to push a number of metal ions from the metallic region 302 toward the bottom electrode 102.

The filament 305 is believed to be comprised of a collection of metal particles that are separated from each other by the non-conducting switching medium and does not define a continuous conductive path, unlike the path 303 in the metallic region 302. The filament 305 extends about 2-10 nm depending on implementation. The conduction mechanism in the ON state is electrons tunneling through the metal particles in the filament 305. The cell resistance is dominated by the tunneling resistance between a metal particle 306 and the bottom electrode 102. The metal particle 306 is a metal particle in the filament region 304 that is closest to the bottom electrode 102 and is the last metal particle in the filament region 304 in the ON state.

FIG. 3B illustrates the cell 100 that is placed in an OFF state by applying an erase voltage $V_{eth}$ to the top electrode. The erase voltage exerts sufficient electromagnetic force to dislodge the metal particles trapped in the defects sites of the a-Si and retrieves at least part of the filament from filament region 304. A metal particle 308 that is closest to the bottom electrode in the OFF state is separated from the bottom electrode by a distance greater than the metal particle 306 during the ON state. This increased distance between the metal particle 308 and the bottom electrode places the cell 100 in a high resistance state compared to the ON state. In an embodiment, the resistance ratio between the ON/OFF states ranges from 10 E3 to 10 E7. Cell 100 behaves like a resistor in the ON state and a capacitor in the OFF state (i.e., the switching medium does not conduct current in any meaningful amount and behaves as a dielectric in the OFF state). In an implementation, the resistance is 10 E5 Ohm in the ON state and 10 E10 Ohm in the OFF state. In another implementation, the resistance is 10 E4 Ohm in the ON state and 10 E9 Ohm in the OFF state. In yet another implementation, the resistance is at least 10 E7 Ohm in the OFF state.

Referring back to FIGS. 2A and 2B, the cell 100 can be controlled to exhibit a diode-like behavior by controlling the amount of current flowing through the cell 100. If the amount of current flowing through the cell 100 is less than a threshold amount, the cell exhibits a diode-like behavior, thereby preventing a reverse current flow from the bottom electrode to the top electrode. In an embodiment, the threshold current is 10 μA so that the cell 100 exhibits non-rectifying characteristics (see FIG. 2A) if the amount of current is 10 μA or more and rectifying characteristics (see FIG. 2B) if the amount of current is less than 10 μA. The current threshold varies according to implementation, e.g., the materials used and the size of the cell.

It is believed that a negative potential applied to the bottom electrode 102 causes the metal particle 306 closest to the bottom electrode 102 (see FIG. 3A) to shift slightly upward without dislodging it from the filament region 304. The resulting increased distance between the metal particle 306 and the bottom electrode 102 increases the resistance and prevents the current from flowing from the bottom electrode to the metal particle 306. If the current, however, is equal to or greater than the threshold level, the large current bursts through the metal 306 from the bottom electrode.

Figure 4:
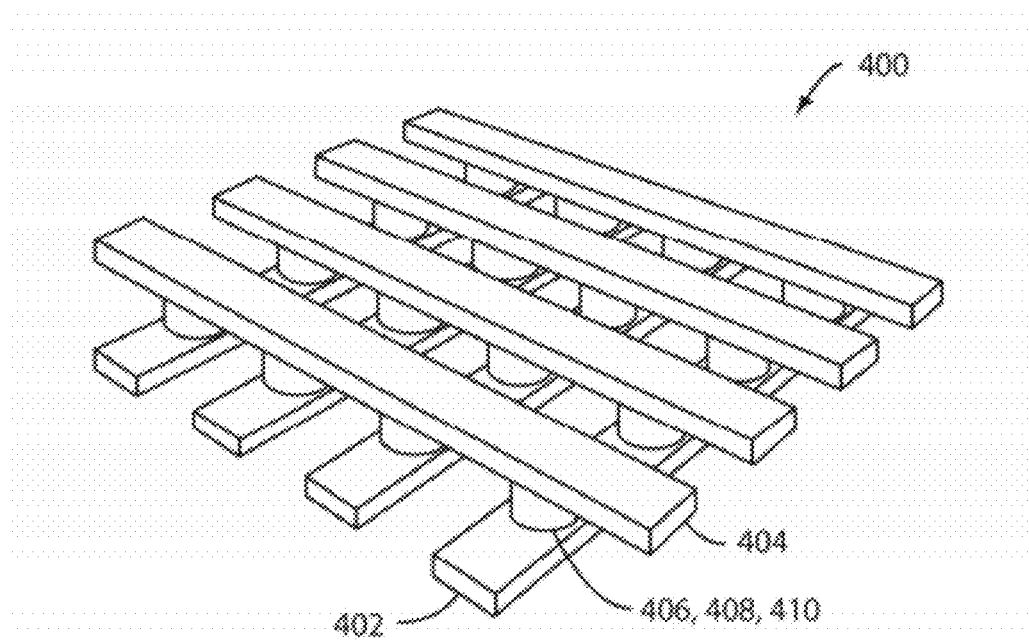
FIG. 4 illustrates a non-crystalline or amorphous silicon (a-Si) based crossbar memory array according to an embodiment of the present invention.

FIG. 4 illustrates a non-crystalline or a-Si based crossbar memory array 400 according to an embodiment of the present invention. A resistive memory device can be implemented in a number of different configurations including NAND, NOR, crossbar, and a hybrid configuration thereof. The crossbar array is illustrated herein merely as an exemplary implementation.

The crossbar memory array 400 includes a parallel array of bottom electrodes 402 extending along a first direction. In an embodiment, the bottom electrodes 402 includes a bottom metal (not shown) and a p-type polysilicon (not shown) formed on the bottom metal. The bottom electrodes 402 are nanoscale in the present embodiment. For example, the bottom electrodes 402 have a width of about 40 nm and a pitch of about 60 nm.

A parallel array of top electrodes 404 extends along a second direction to intersect the bottom electrodes 402. The top electrodes 404 include metals capable of supplying filament-forming ions such as silver (Ag), gold (Au), nickel (Ni), aluminum (Al), chromium (Cr), iron (Fe), manganese (Mn), tungsten (W), vanadium (V) and cobalt (Co). In an embodiment, the top electrodes 404 and the bottom electrodes 402 are orthogonal to each other. The top electrodes 404 are nanowires having a width of about 60 nm and a pitch of about 150 nm.

Each intersection 406 of the two arrays defines a two-terminal resistive memory cell 408. The memory cell 408 at each intersection 406 includes two electrodes separated by a switching layer 410. The switching layer or structure can be the same width or narrower than the bottom electrode. In some embodiments, each memory cell in a crossbar memory array can store a single bit. In other embodiments, the memory cells exhibit multi-level resistance thereby allowing storage of a plurality of bits at each cell.

In the present embodiment, the switching layer 410 includes amorphous silicon or other non-crystalline silicon. As used herein, the term "amorphous silicon" refers to silicon material that is in a substantially amorphous phase and may include small grains of crystalline silicon. As used herein, the term "non-crystalline silicon" refers to amorphous silicon or amorphous polysilicon that exhibits controllable resistance, a combination thereof, or the like.

The crossbar memory array as described above may be fabricated on a silicon substrate in an embodiment. In an embodiment, a silicon-germanium substrate is used. In another embodiment, III-V type semiconductor compounds (such as gallium arsenide (GaAs), gallium nitride (GaN), boron nitride (BN), etc.) or II-VI type semiconductor compounds (such as cadmium selenide, zinc telluride, etc.) may also be used as the substrate.

Figure 5:
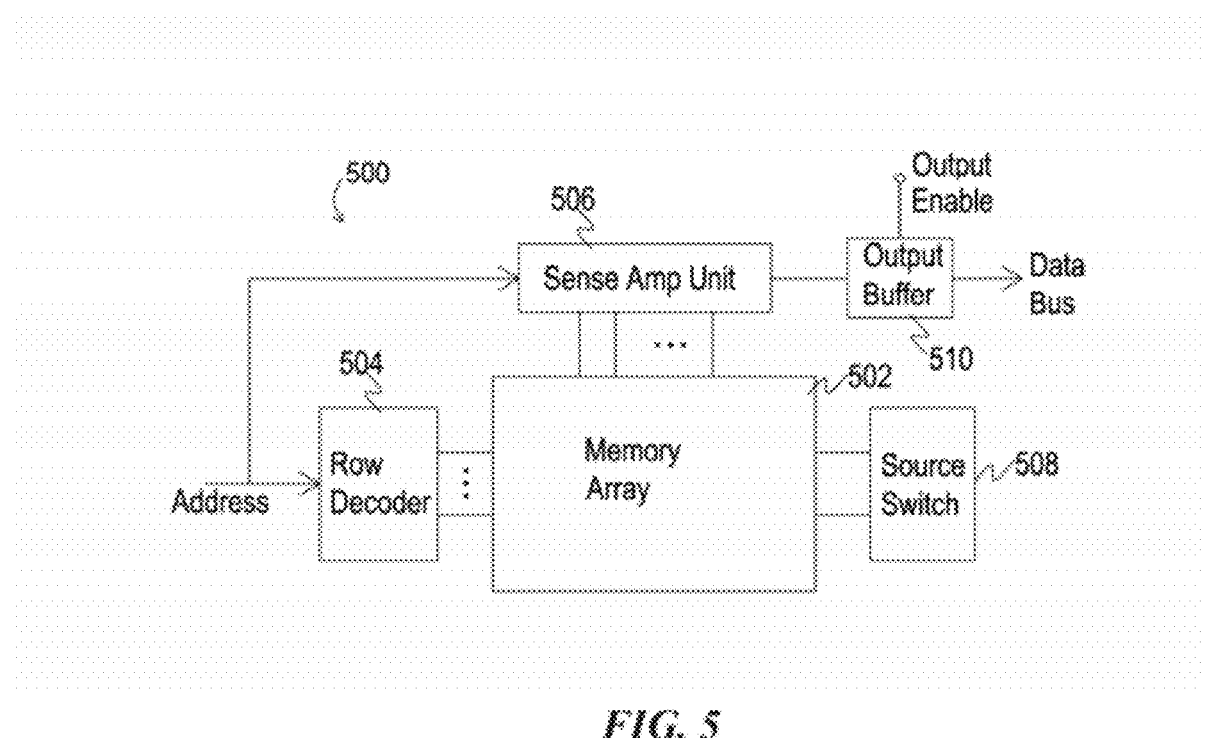
FIG. 5 illustrates a block diagram of a non-volatile memory device according to an embodiment of the present invention.

FIG. 5 illustrates a block diagram of a non-volatile resistive memory device 500 according to an embodiment of the present invention. Device 500 includes a memory array 502 including a plurality of memory units. Each memory unit is associated with a select transistor (see FIG. 6) and includes a plurality of resistive memory cells. A row decoder 504 receives the address of a resistive memory cell (or cells) to be operated on and selects the word line associated with the memory unit of the selected resistive memory cell (or cells). A control voltage, e.g., $V_{cc}$, is then applied to turn on the select transistor assigned to that memory unit. A sense amplifier unit 506 applies a read voltage concurrently to the cells in the selected memory unit to read these cells. A source switch 508 applies a voltage suitable for an operation to be performed on a source line of the selected memory unit. The sense amplifier unit senses the voltage output by each of the selected memory cells to determine whether or not it has been erased or programmed. An output buffer 510 receives data sensed by the sense amplifier 506 and outputs the data to a data bus according to an output enable signal.

Figure 6A:
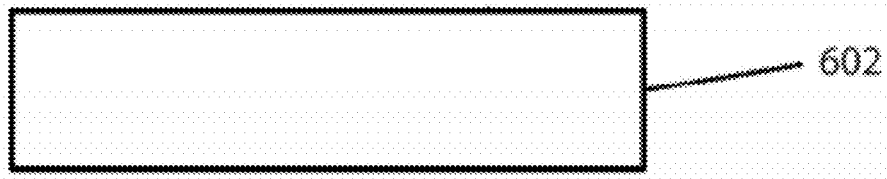
FIGS. 6A-6P illustrate a method for making a memory device according to an embodiment of the present invention.
Figure 6B:
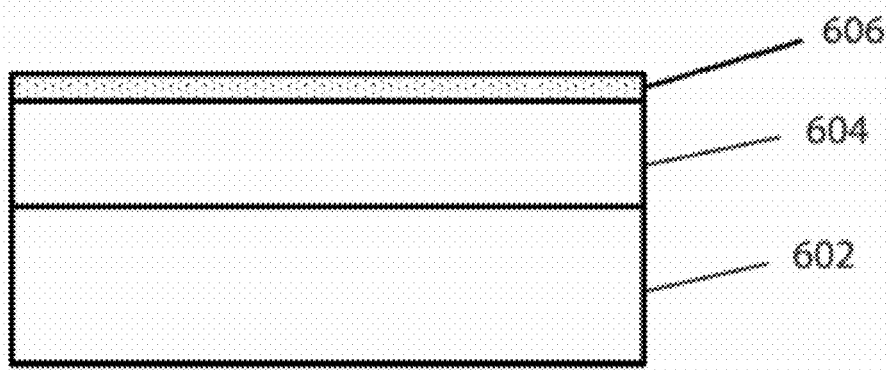
Figure 6C:
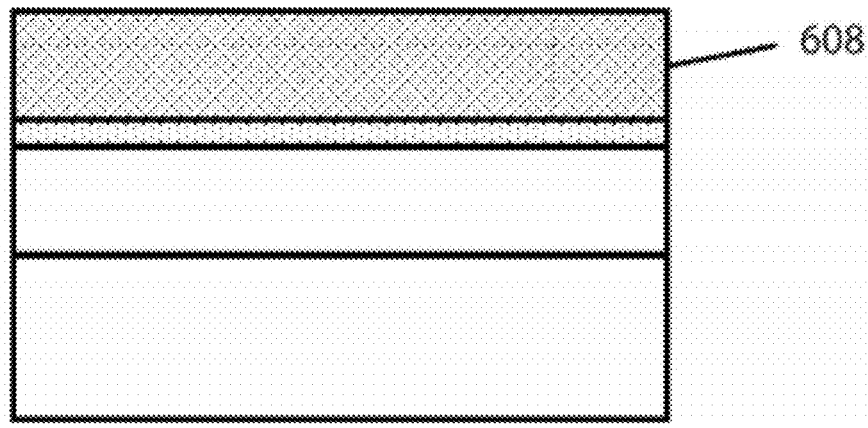
Figure 6D:
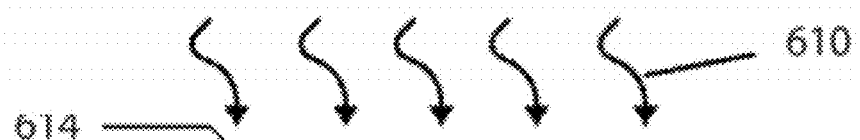
Figure 6E:
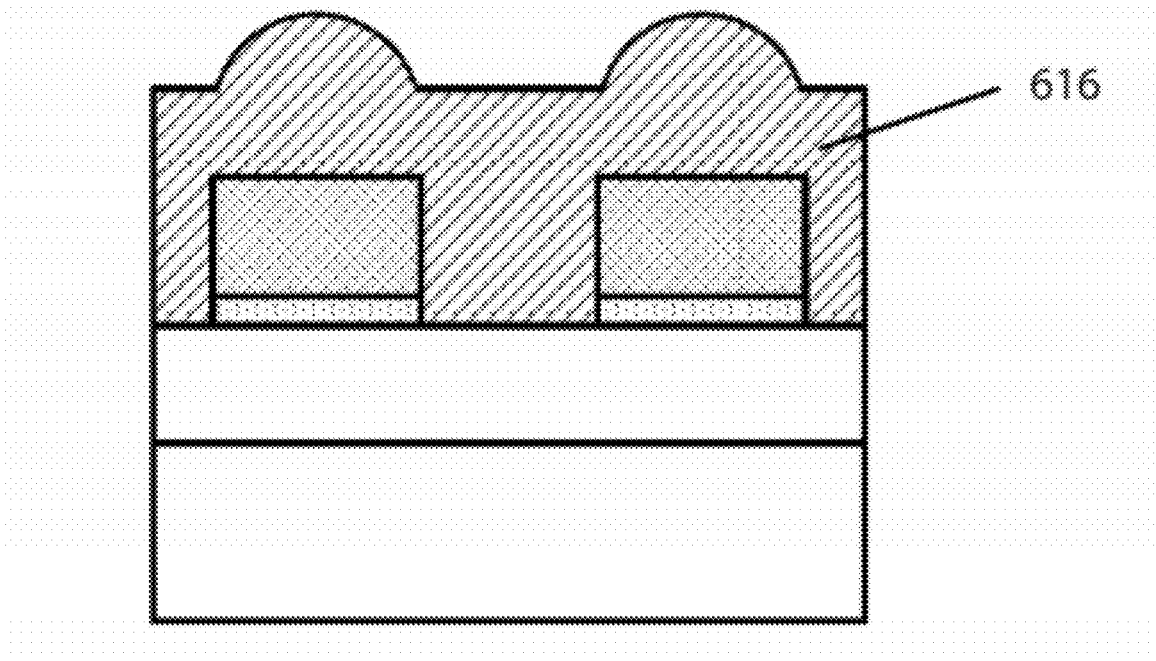
Figure 6F:
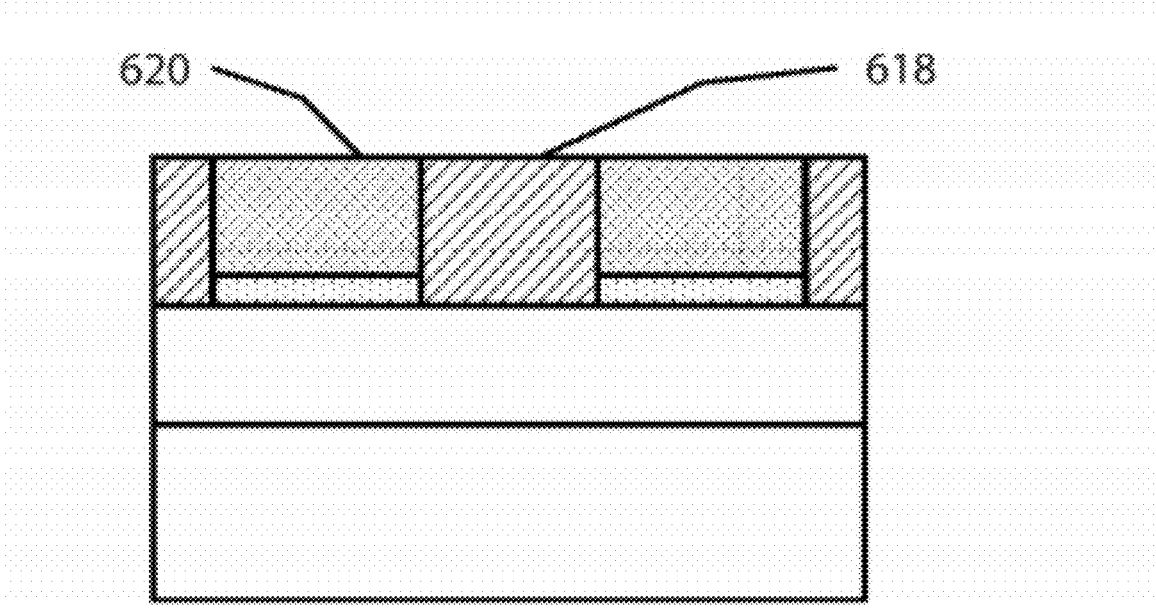
Figure 6G:
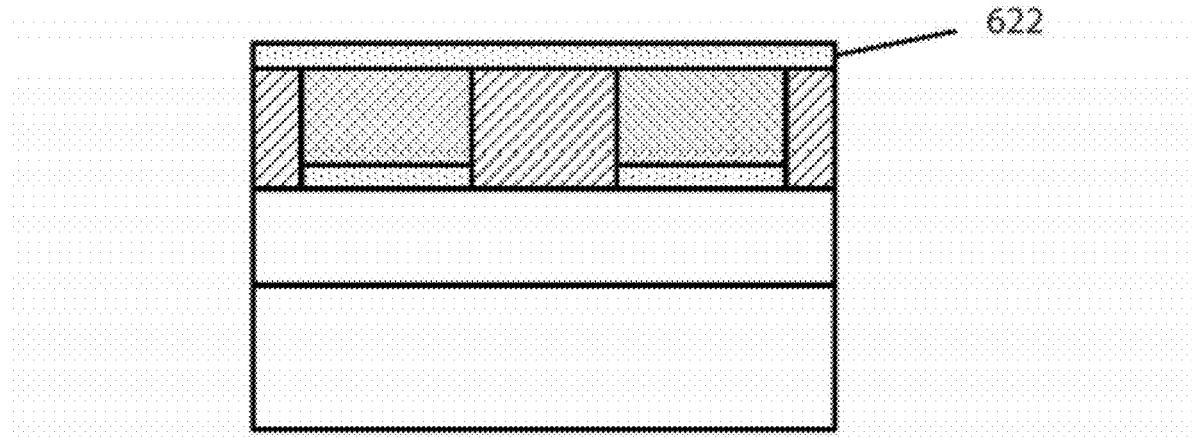
Figure 6H:
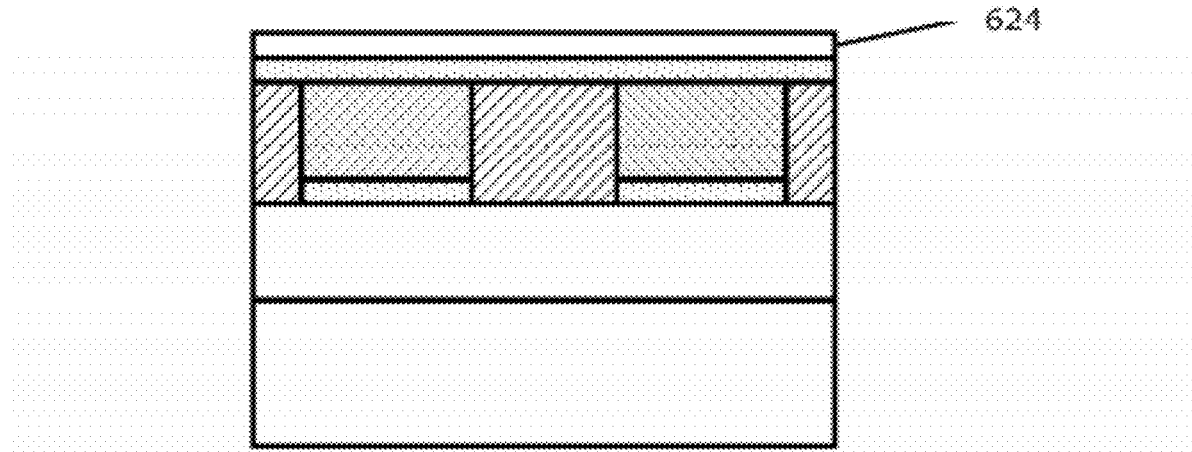
Figure 6I:
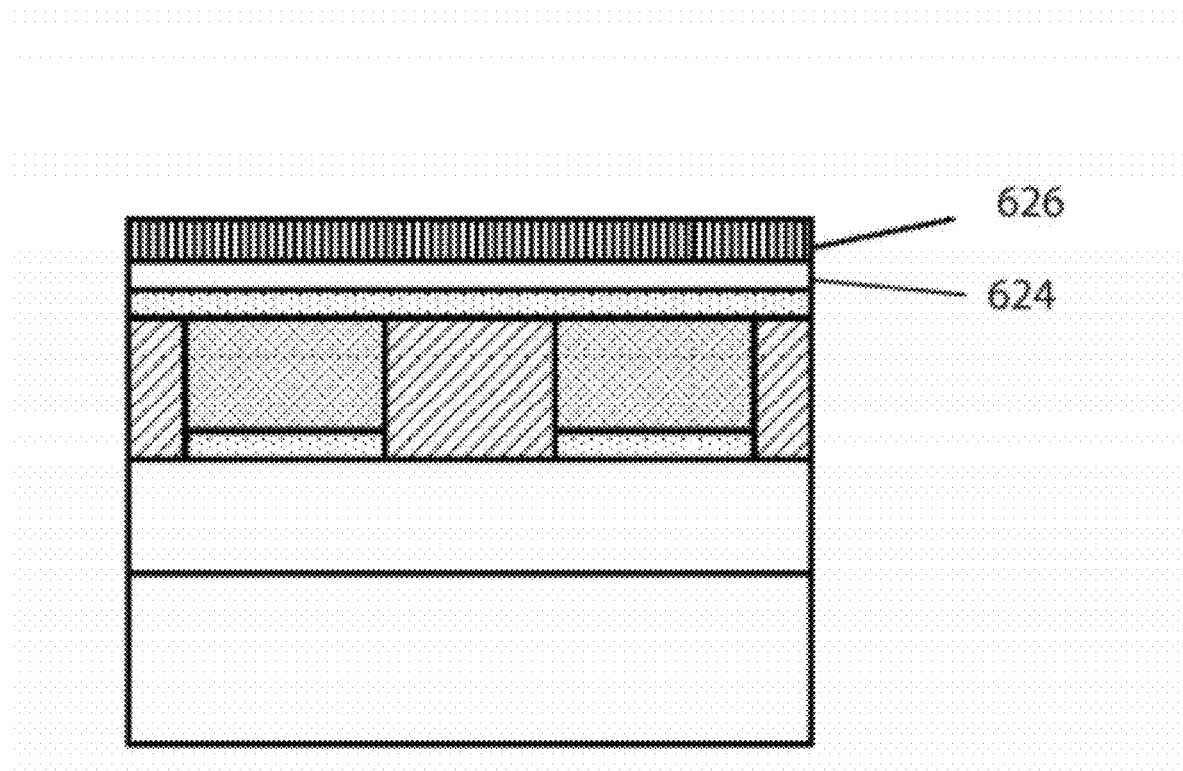
Figure 6K:
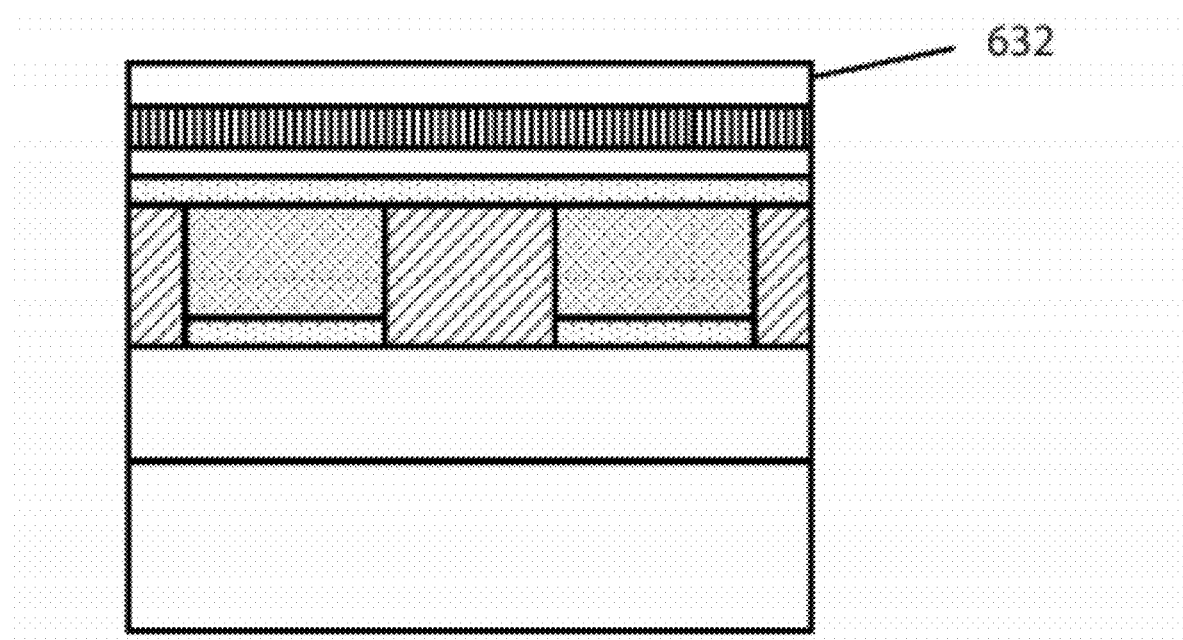
Figure 6J:
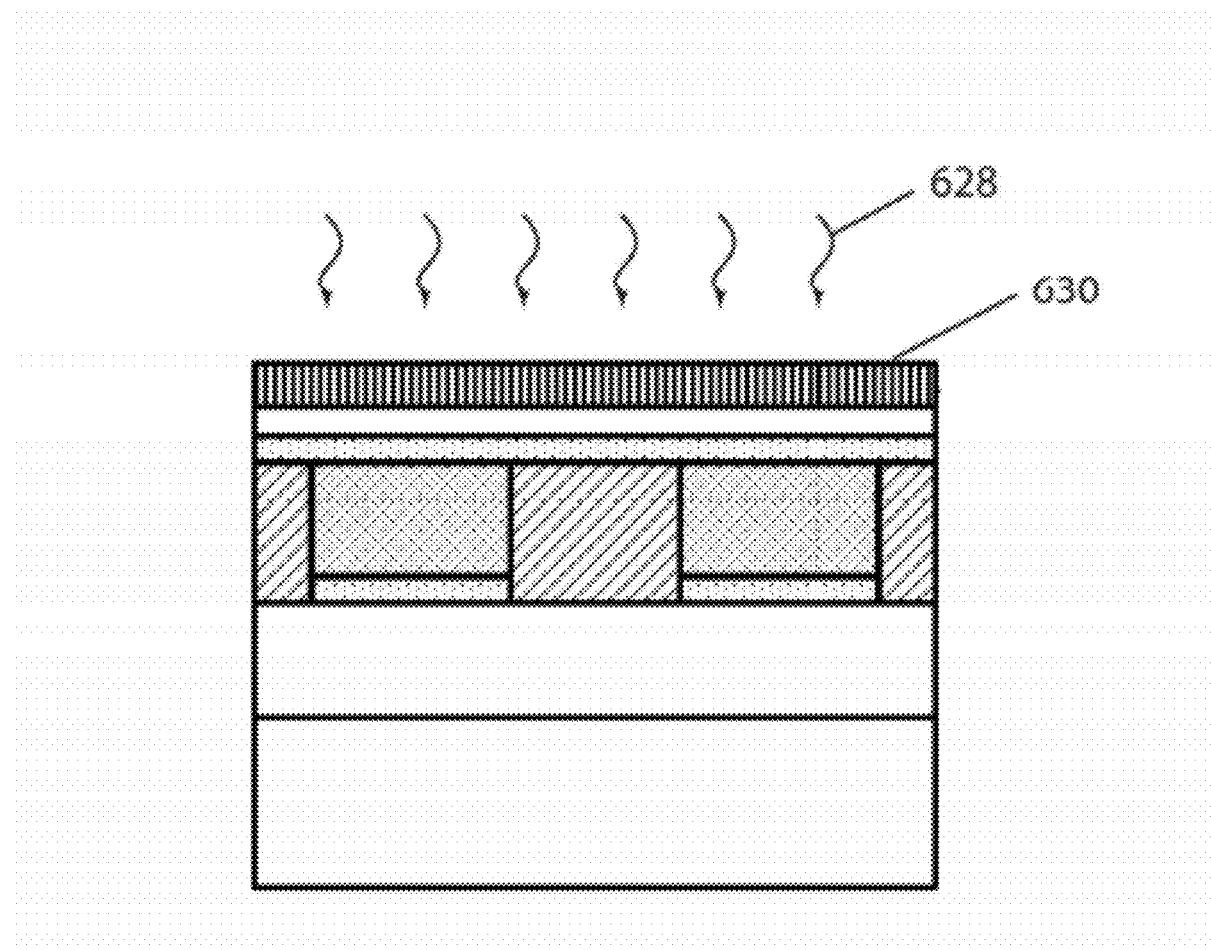
Figure 6L:
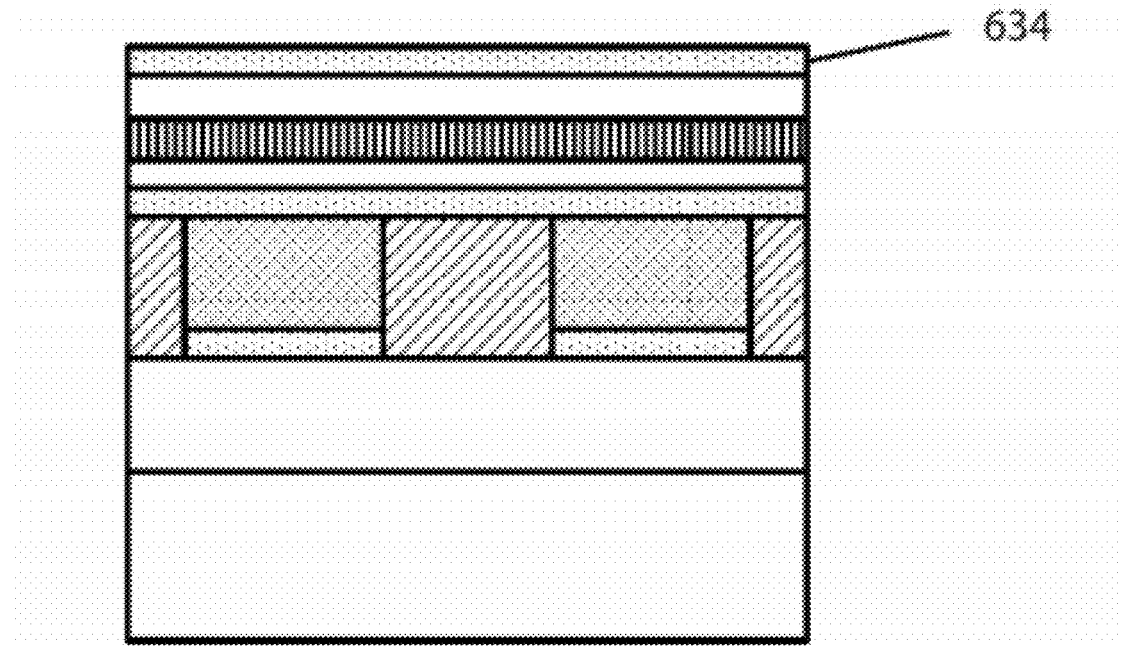
Figure 6M:
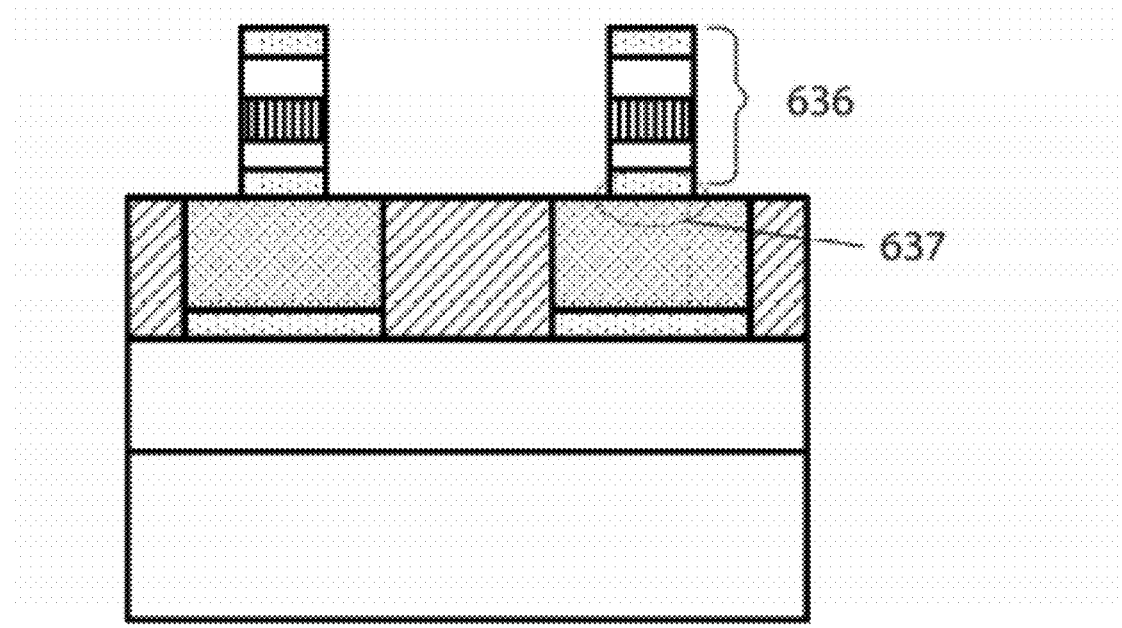
Figure 6N:
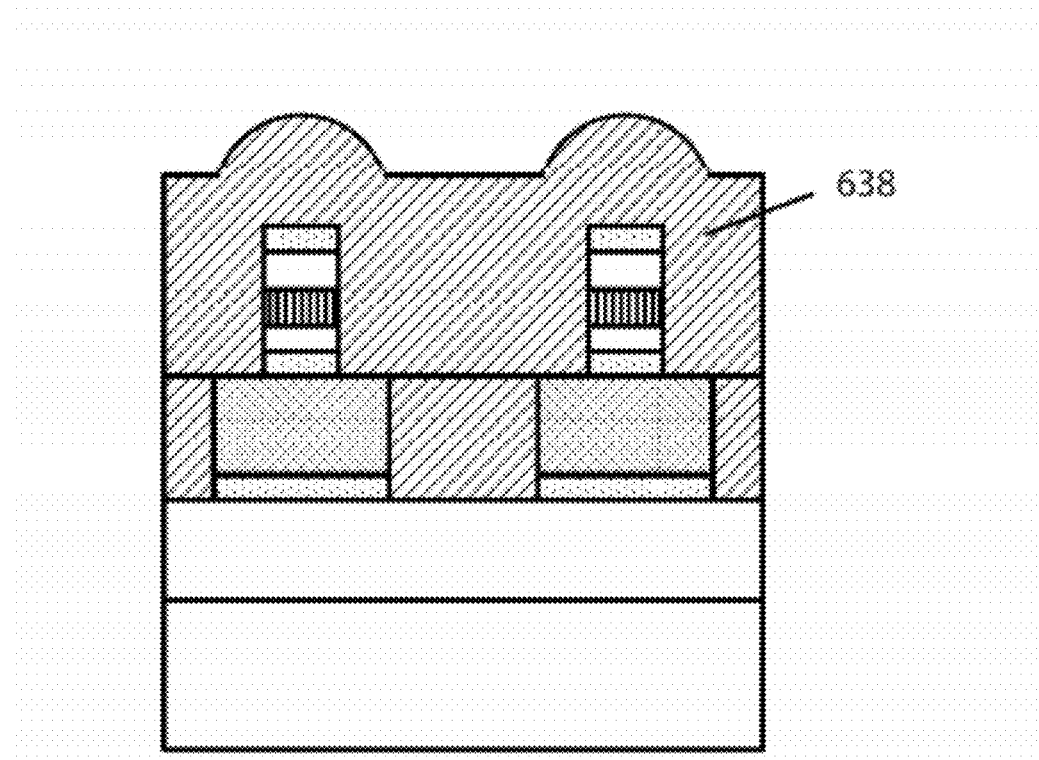
Figure 6O:
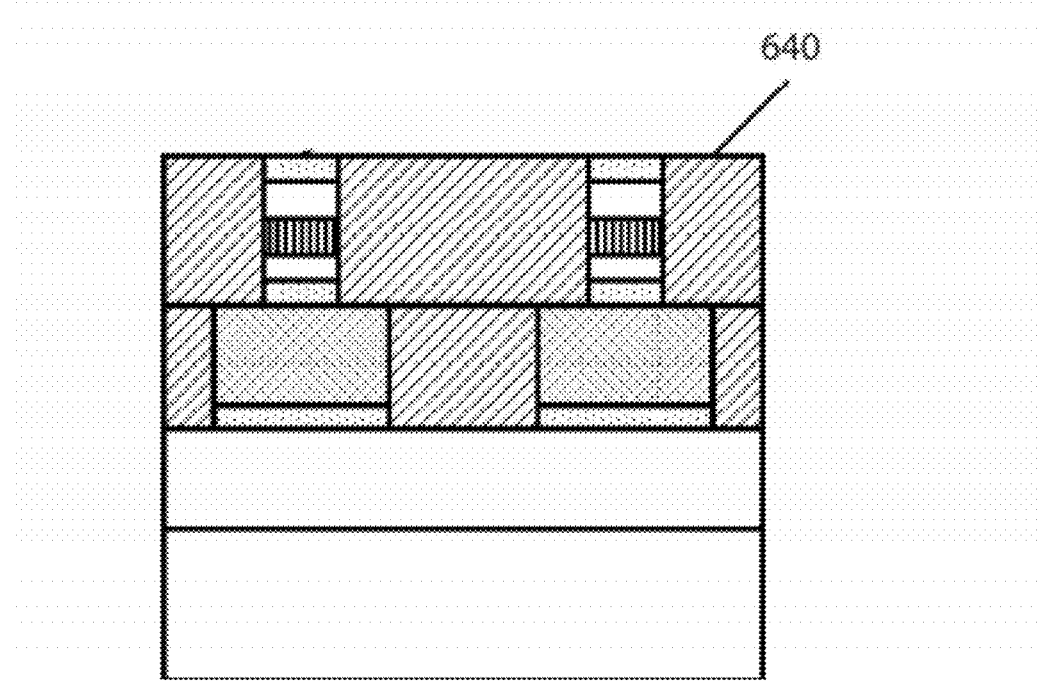
Figure 6P:
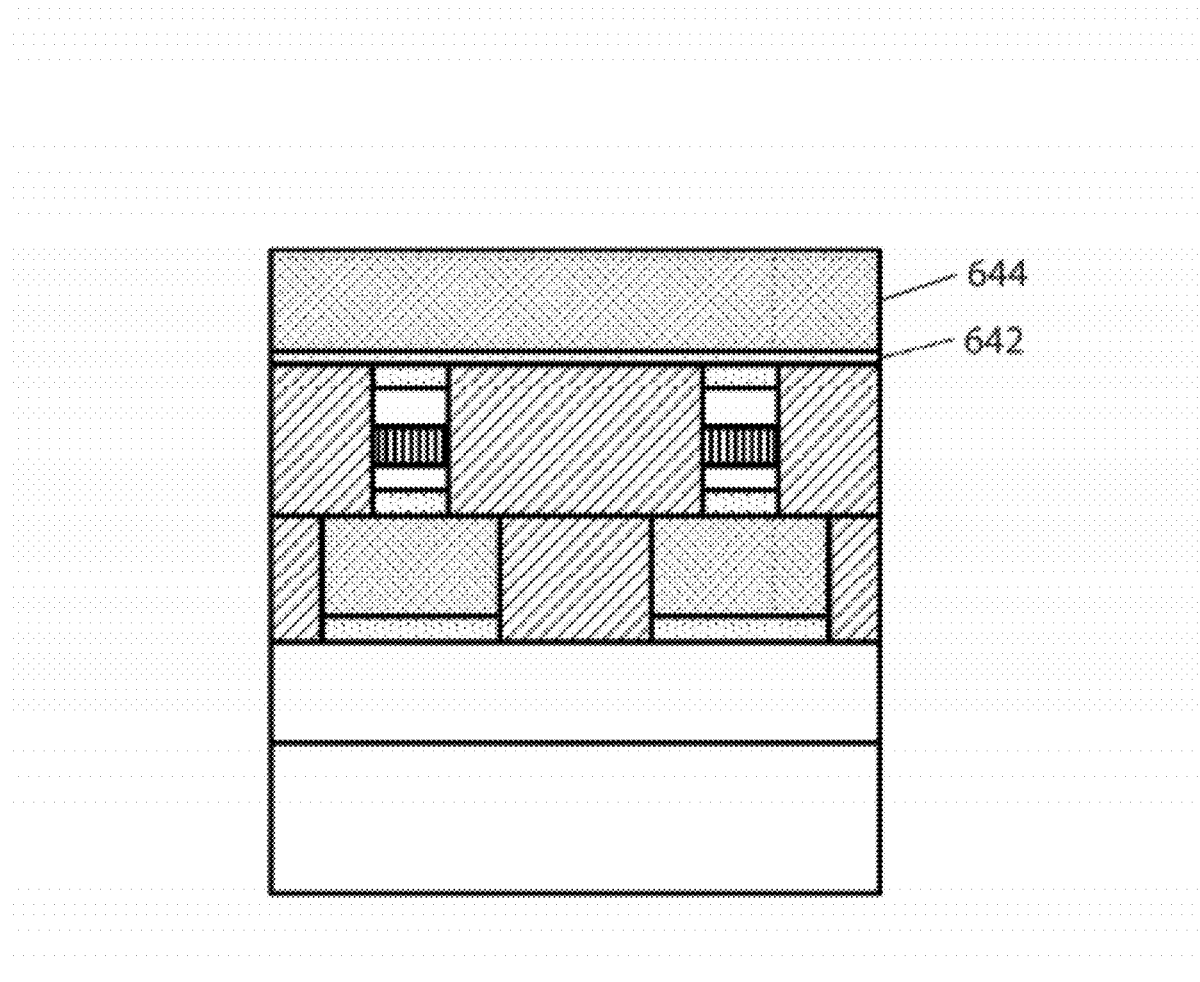

FIGS. 6A to 6P illustrate a method for a fabricating a memory device, e.g., a resistive memory device according to an embodiment of the present invention. The method produces a memory device having a smooth, continuous silver film among other features. In an embodiment, the memory device includes a memory array having a plurality of resistive memory cells formed over control circuits that are formed on a substrate. The control circuits, e.g., a row decoder, a sense amplifier, etc. (see FIG. 5), are used to control the operation of the resistive memory cells. In another embodiment, a plurality of memory arrays is stacked vertically to provide multiple levels of memory arrays on a substrate.

Referring to FIG. 6A, according to an embodiment of the present invention, a substrate 602 having one or more devices (not shown) including transistors and other circuit components formed thereon is provided. The substrate is a semiconductor substrate in the present embodiment. The semiconductor substrate can be a single crystal silicon wafer, a silicon germanium wafer, or a silicon-on-insulator substrate, commonly known as SOI, and the like, depending on implementation. The one or more devices (not shown) define control circuits for a plurality of resistive memory cells to be formed over the substrate 602 in the present embodiment.

A first dielectric material 604 is formed over an upper surface region of the semiconductor substrate (FIG. 6B). The first dielectric material may be silicon oxide, silicon nitride or a combination thereof, or other suitable dielectric materials depending on implementation. The first dielectric material can be deposited using techniques such as chemical vapor deposition (CVD) process including plasma enhanced chemical vapor deposition or low pressure chemical vapor deposition depending on the application. For example, silicon oxide may be formed using silane, disaline, a suitable chlorosilane or TEOS and others depending on the embodiment. A first adhesion layer 606 is formed over the first dielectric material. The first adhesion layer can be titanium, titanium nitride, tantalum, tantalum nitride, or tungsten nitride or a combination thereof. The first adhesion layer may be deposited using a physical vapor deposition process such as sputtering.

A first wiring material 608 is formed over the first adhesion layer (FIG. 6C). The first wiring material is glue to the first dielectric layer by the first adhesion layer in the present embodiment. The first wiring material 608 is tungsten formed to a thickness of between 100 nm and 1000 nm, e.g., between 200 nm and 500 nm, in the present embodiment. In other embodiments, the first wiring material can be copper, aluminum or other suitable conductive materials including alloys. The first wiring material can be deposited using techniques such as physical vapor deposition, evaporation, chemical vapor deposition, electrochemical methods such as electroplating or electrode-less deposition from a liquid medium, or other suitable deposition techniques including a combination of these. In certain embodiments, the first wiring material can be a doped semiconductor material such as a doped silicon material.

The first wiring material and the first adhesion material are etched 610 to form a first wiring structure 612 including in the present embodiment (FIG. 6D). The first wiring structure has a width 614 of about 5 nm to about 1200 nm, e.g., about 30 nm to about 100 nm. The etch process 610 includes forming a masking layer (not shown) overlying the first wiring material followed by an etching process. The masking layer can be an organic photoresist material or a hard mask depending on the application. The first adhesion layer is titanium/titanium nitride in the present embodiment. The etching process can use a fluorine bearing species such as $CF_4$ as etchant.

A second dielectric material 616 is formed over the first wiring structure (FIG. 6E). The second dielectric material can be silicon oxide, silicon nitride, or other suitable dielectric materials including a dielectric stack and a combination of various dielectric materials. In the present embodiment, the second dielectric material is silicon oxide and is deposited using a plasma enhanced chemical vapor deposition (PECVD) process using tetra-ethyl oxy-silicate (TEOS) as precursor. Other deposition method such as spin on glass followed by a suitable curing step may be used. Alternatively, a combination of more than one deposition processes may be used depending on implementation.

A planarizing process is performed to form a planarized second dielectric layer surface region 618 and expose a first wiring structure surface 620 (FIG. 6F). The planarizing process can be a chemical mechanical polishing (CMP) process using the first wiring (e.g., tungsten) structure surface as a polishing stop. Alternatively, the planarizing process can be an etch-back process.

A bottom metal layer 622 is deposited over the planarized second dielectric layer surface region 618 and the exposed first wiring structure surface 620 (FIG. 6G). In an embodiment, the bottom metal layer has a thickness of no more than 30 nm, e.g., about 10 nm. The bottom metal layer may be deposited using a physical vapor deposition process such as sputtering, a chemical vapor deposition, or other suitable deposition techniques according to implementation. In the present embodiment, the bottom metal serves to minimize the resistance of the bottom electrode of the resistive memory cell to be formed. The bottom metal may not be needed in certain implementations. The bottom metal can be tungsten (W), titanium nitride (TiN), titanium-tungsten (TiW), tungsten nitride (WN), tantalum (Ta), or tantalum nitride (TaN), or a stack (or stacks) of metals. The bottom metal preferably should comprise metal with good diffusion barrier properties. In another embodiment, the bottom metal layer preferably should have a high voltage threshold for ion migration (e.g., higher than that of the metal used for the top electrode).

A contact layer 624 including silicon material is formed over the bottom metal layer (FIG. 6H). The contact layer and the bottom metal layer define a bottom electrode of a resistive memory cell to be formed. In an embodiment, the contact layer is a p-type polycrystalline semiconductor layer (e.g., polysilicon or poly-SiGe layer) having a high doping concentration of $10\ E17/cm^3 \sim 10\ E22/cm^3$. In an embodiment, the contact layer has a doping concentration of at least $1E20/cm^3$, e.g., about $5\ E20/cm^3$. The contact layer may be doped with acceptors such as Boron (B) or Aluminum (Al).

In an embodiment, the contact layer is poly-SiGe layer having a thickness of 10-80 nm and is deposited by using a low pressure chemical vapor deposition (LPCVD) process at a chamber pressure of 2 Torr, at 400° C. The crystallization temperature can be lowered by increasing the concentration of Ge, so that the resulting poly-SiGe has the Ge concentration of about 70%. Gases input into the process chamber include: diborane (1%, $H_2$ balance) at 10 sccm, $SiH_4$ at 7 sccm, and $GeH_4$ (10%) at 40 sccm. P-type impurities are doped into poly-SiGe by in-situ doping using $B_2H_6$ or $BCl_3$, or both. In addition to LPCVD, other deposition techniques may also be used to deposit poly-SiGe over the bottom electrode, e.g., atmospheric pressure CVD (APCVD) and plasma enhanced chemical vapor deposition (PECVD). In an embodiment, the contact layer is a p-type polysilicon layer having a thickness of 10~80 nm.

Referring to FIG. 6I, a switching material 626 is formed over the contact layer 624. The switching material defines a switching medium wherein a filament (see FIG. 3A) will be formed when a program voltage is applied to place the resistive memory cell in ON state. In the present embodiment, the switching material is amorphous silicon.

In the present embodiment, the switching material is formed using a chemical vapor deposition method. The chemical vapor deposition method can include a process using silane, disilane, a suitable chlorosilane, or a suitable silicon-containing gas as a precursor. The intrinsic amorphous silicon material may be deposited using a plasma-assisted chemical deposition method. Deposition temperature for the amorphous silicon material can range from about 200 degree Celsius to about 500 degree Celsius and preferably at about 350 degree Celsius to about 400 degree Celsius. Depending on implementation, the amorphous silicon material can be provided at a thickness ranging from about 2 nm to about 100 nm, e.g., about 30 nm to about 60 nm. In another embodiment, the amorphous silicon material may also be deposited using a physical vapor deposition such as sputtering using a silicon target material.

Referring to FIG. 6J, a precleaning process 628 is performed on a surface 630 of the switching material, e.g., amorphous silicon, to remove native oxide (not shown) formed on the surface 630. A thin layer, e.g., about 20 angstroms, of native oxide tends to form on the amorphous silicon switching material if the substrate is exposed to air. In an embodiment, an argon sputter clean is performed immediately prior to silver deposition (i.e., no air break between the sputter clean and deposition of silver) to remove the oxide so that metal layer such as silver can be deposited directly onto the amorphous silicon rather than on the oxide, thereby preventing metal agglomeration. In another embodiment, the native oxide is removed by dipping the substrate having the amorphous silicon into a hydrogen solution, e.g., hydrofluoric acid (HF). In yet another embodiment, the native oxide is removed using a plasma etch process.

In a conventional semiconductor fabrication step, native oxide may not be removed since small amounts of native oxide typically do not significantly effective the electrical characteristics of the device. However, in the present embodiment, the native oxide is removed since oxide tends to cause metal, e.g., silver, to agglomerate. Silver agglomeration results in numerous lumpy structures on the amorphous silicon that make it difficult to form nanoscale patterns. One way to prevent silver agglomeration is to deposit the silver to a thickness of 1000 angstroms or more; however, this may make the silver layer too thick for practical implementation in making nanoscale resistive memory cells.

In an embodiment, the precleaning process is performed to remove native oxide even if the oxide has a thickness of no more than 10 angstroms in order to minimize silver agglomeration. In another embodiment, the precleaning process is performed to remove native oxide even if the oxide has a thickness of no more than 5 angstroms. In another embodiment, the precleaning process is performed if there is any detectable amount of oxide on the amorphous silicon.

A metal layer 632 including silver is formed over the switching material 626 after the precleaning process has removed the native oxide (FIG. 6K). In the present embodiment, the silver metal layer 632 is deposited directly on the amorphous silicon material 626 to a thickness of less than 1000 angstroms, e.g., about 600 angstroms or less, or about 400 angstroms or less, or 200 angstroms or less, or 100 angstroms or less. The silver metal layer 632 is generally a smooth, continuous film even thought a very thin layer is deposited over the amorphous silicon material 626 since the native oxide has been removed by the precleaning process 628 and the silver metal layer is deposited on the amorphous silicon rather than on the oxide.

Figure 7A:
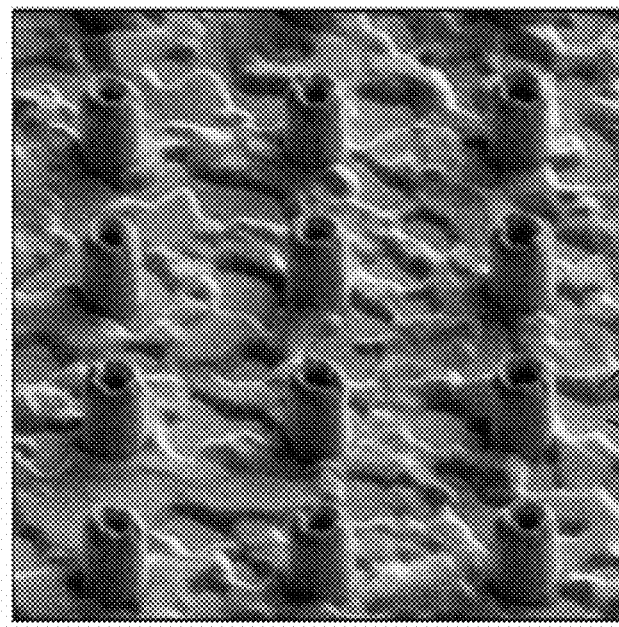
FIG. 7A illustrates a silver agglomeration on an amorphous silicon layer when a silver metal layer is deposited over the amorphous silicon layer without performing a precleaning process to remove native oxide.
Figure 7B:
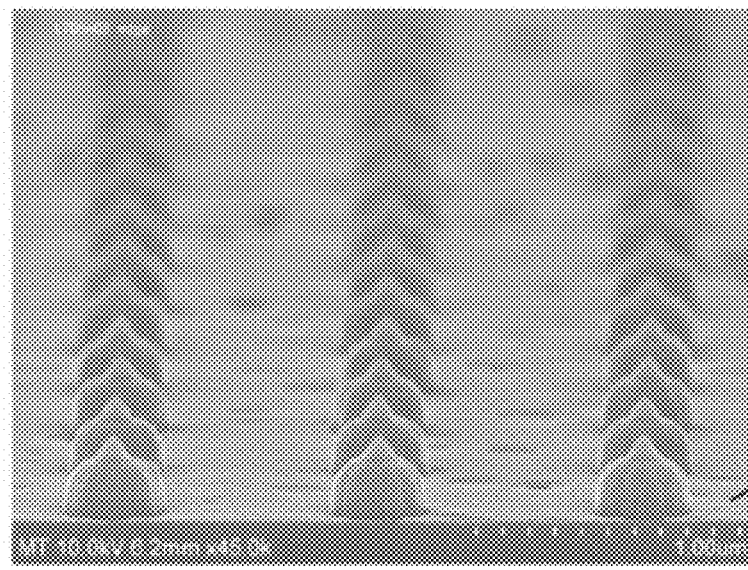
FIG. 7B illustrates that no noticeable silver agglomeration occurs on an amorphous silicon layer if silver is deposited after native oxide is removed by a precleaning process.

FIG. 7A illustrates a silver agglomeration 702 on an amorphous silicon layer 704 when a silver metal layer is deposited over the amorphous silicon layer 704 without performing a precleaning process to remove the native oxide. That is, these lumpy silver structures cause difficulties during subsequent deposition and patterning processes due to their irregular shapes. FIG. 7B illustrates an amorphous silicon layer 706 having no noticeable silver agglomeration where a silver metal layer is deposited after the native oxide is removed by a precleaning process. The resulting smooth, continuous silver film facilitates the formation of nanoscale patterns thereon.

Referring back to FIG. 6K, the silver metal layer 632 supplies silver ions to the amorphous silicon switching material 626 so that a filament can be formed therein. The silver material can be deposited using a physical deposition process such as sputtering, evaporation, or a chemical deposition process such as chemical vapor deposition, electrochemical such as electroplating, electrodeless deposition, or a combination thereof.

A top barrier material 634 is formed over the conductive material (FIG. 6L). The top barrier material layer can protect the silver metal layer 632 from oxidation and can also serve as a diffusion barrier between the silver metal layer and subsequent materials formed thereon. Additionally, the top barrier material can provide an electrical contact between the silver metal layer 632 and subsequent materials and serve as a polish stop material in a subsequent step for a CMP process. The top barrier material can be titanium, titanium nitride, tantalum or tantalum nitride, tungsten, or tungsten nitride, or any suitable barrier material depending on implementation.

A plurality of pillar structures 636 is formed by etching the top barrier material, the silver metal layer, the switching material, the contact layer, and the bottom metal layer (FIG. 6M). Each of the pillar structures defines a resistive memory cell (e.g., the memory cell 100 in FIG. 1) and includes the top barrier material, the silver metal layer, the switching material, the contact layer, and the bottom metal layer. The top barrier material and the silver metal layer define a top electrode (e.g., numeral 106 of FIG. 3A); the switching material defines a switching medium (e.g., numeral 104 of FIG. 3A); the contact layer and the bottom metal layer define a bottom electrode (e.g., numeral 102 of FIG. 3A) of a resistive memory cell. In the present embodiment, the bottom metal layer of each of the pillar structures maintains a metal-to-metal contact 637 with the first wiring structure.

Figure 8:
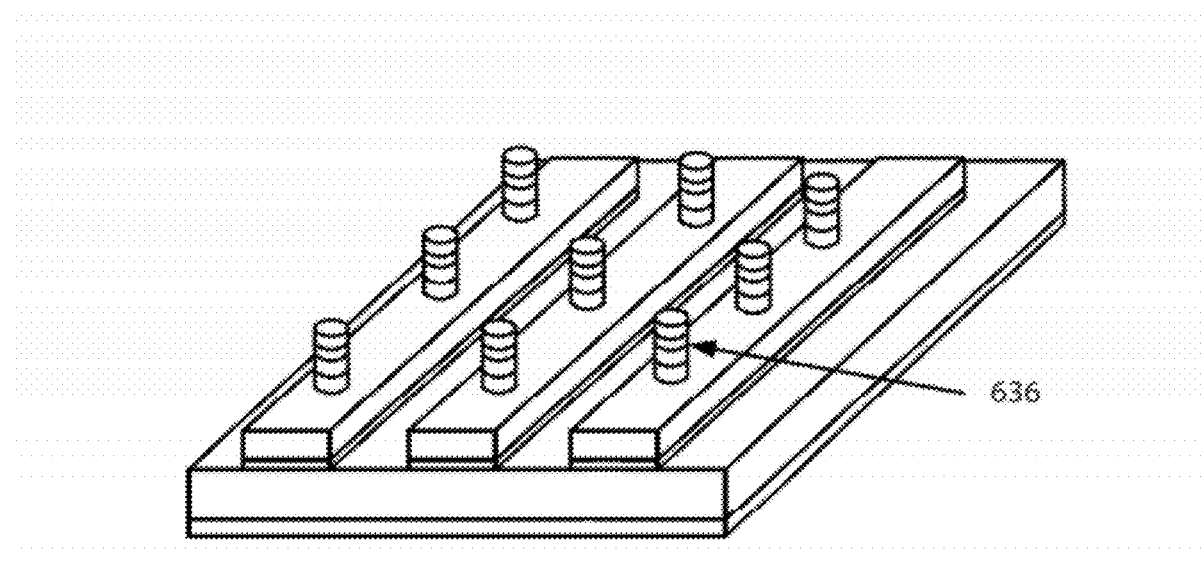
FIG. 8 illustrates a perspective view of a plurality of pillar structures according to an embodiment of the present invention.

In an embodiment, the pillar structure has a feature size of no more than about 250 nm, e.g., about 90 nm or about 40 nm depending on the technology adopted. The bottom wiring structure has a width of about 90 nm or greater. A perspective view of a plurality of pillar structures 636 on the first wiring structure is illustrated in FIG. 8.

Referring to FIG. 6N, after forming the pillar structures, a third dielectric material 638 is deposited over at least the plurality of pillar structures including exposed regions of the first wiring structures. The third dielectric material can be silicon oxide, silicon nitride, or suitable dielectric material including a dielectric stack with a combination of various dielectric materials depending on the embodiment. As merely an example, the third dielectric material can be a silicon oxide deposited using a plasma enhanced chemical vapor deposition (PECVD) process using tetra-ethyl oxy-silicate as precursor. Other deposition method such as spin on glass followed by a suitable curing step may be used. Alternatively, a combination of deposition processes may be used depending on the application.

The third dielectric layer is subjected to a planarizing process to form a planarized third dielectric layer surface 636 and expose a top surface region 640 of the pillar structure (FIG. 6O). The exposed top surface region of the pillar structure includes a surface region of the top barrier material. The planarizing process can be a chemical mechanical polishing (CMP) process using the top barrier material as a polishing or an etch-back process.

A second adhesion material 642 is deposited over the planarized third dielectric layer surface and the top surface region of the pillar structure (FIG. 6P). The second adhesion layer can be titanium, titanium nitride, tantalum, tantalum nitride, or tungsten nitride or a combination of these. The second adhesion material may be deposited using a physical vapor deposition process such as sputtering in a specific embodiment. Techniques such as a chemical vapor deposition including atomic layer deposition using a suitable precursor may also be used.

A top wiring material 644 is deposited over the second adhesion material. The second wiring material can be tungsten, copper, aluminum or other suitable metal materials including alloys. The top wiring material can be deposited using techniques such as physical vapor deposition, evaporation, chemical vapor deposition, electrochemical methods such as electroplating or electrodeless deposition from a liquid medium, or other suitable deposition techniques including a combination. In certain embodiments, the top wiring material can be a doped semiconductor material such as a doped silicon material. In a specific embodiment, the second adhesion material functions as a glue layer between the top wiring material and the third dielectric layer. Taking tungsten as the second wiring material as an example, tungsten can have a thickness ranging from about 100 nm to about 1000 mu, e.g., about 200 nm to about 500 nm depending on the application. The top wiring material is etched to form a top wiring pattern (not shown). In an embodiment, additional deposition and etching steps are performed over the top wiring pattern to obtain multiple levels of pillars structures, so that a plurality of memory arrays are vertically stacked.

A number of embodiments have been described. For example, a memory device is described as including a plurality of resistive memory cells; however, other types of memory cells may be used. Similarly, the memory cell is described as having a pillar structure, but other structures are possible. A person skilled in the art will understand that various modifications may be made without departing from the spirit and scope of the invention.

What is claimed is:

1. A method for forming a semiconductor device including a resistive memory cell, the method comprising:
   providing a substrate having an upper surface;
   forming a first conductive layer over the upper surface of the substrate;
   forming an amorphous silicon layer over the first conductive layer;
   cleaning a surface of the amorphous silicon layer to remove native oxide formed on the surface of the amorphous silicon layer;
   depositing a silver layer over the amorphous silicon layer after removing the native oxide by performing the cleaning step; and
   etching the amorphous silicon layer and the silver layer to form a pillar comprising amorphous silicon and silver above the first conductive layer,
   wherein the resistive memory cell includes the first conductive layer, the amorphous silicon layer, and the silver layer, and
   wherein the surface of the amorphous silicon layer is cleaned to prevent silver agglomeration on the native oxide.

2. The method of claim 1, wherein cleaning step includes sputter etching using an inert gas, wherein the silver layer is formed directly on the amorphous silicon layer.

3. The method of claim 1 wherein the cleaning step includes dipping the substrate having the amorphous silicon layer in a solution including hydrogen fluoride.

4. The method of claim 1, wherein the native oxide has a thickness of no more than 30 angstroms.

5. The method of claim 4, wherein the native oxide has a thickness of no more than 10 angstroms.

6. The method of claim 1, wherein the silver layer is formed to a thickness of no more than 800 angstroms.

7. The method of claim 6, wherein the silver layer is formed to a thickness of no more than 300 angstroms.

8. The method of claim 6, wherein the silver layer is formed to a thickness of no more than 100 angstroms.

9. The method of claim 1, wherein substrate including a control circuit formed on or below the surface of the substrate, so that the resistive memory cell is formed over the control circuit, the control circuit being configured to control an operation of the resistive memory cell.

10. A method for forming a semiconductor device having a resistive memory cell, the method comprising:
    providing a substrate having an upper surface;
    forming a first conductive layer over the upper surface of the substrate;
    forming an amorphous silicon layer over the first conductive layer;
    cleaning a surface of the amorphous silicon layer to remove oxide formed on the surface of the amorphous silicon layer;
    depositing a silver layer on the amorphous silicon layer after removing the native oxide by performing the cleaning step, the silver layer being no more than 300 angstroms in thickness; and
    etching the amorphous silicon layer and the silver layer to form a pillar comprising amorphous silicon and silver above the first conductive layer,
    wherein the resistive memory cell includes the first conductive layer, the amorphous silicon layer, and the silver layer, and
    wherein the surface of the amorphous silicon layer is cleaned to prevent silver agglomeration on the oxide.

11. The method of claim 10, wherein substrate including a control circuit formed on or below the surface of the substrate, so that the resistive memory cell is formed over the control circuit, the control circuit being configured to control an operation of the resistive memory cell.

12. The method of claim 11, wherein the oxide is no more than 10 angstroms in thickness.

13. The method of claim 11, wherein cleaning step includes sputter etching using an inert gas.

14. The method of claim 13, wherein cleaning step includes sputter etching using argon.

15. The method of claim 11, wherein the first conductive layer includes a polycrystalline silicon film of no more than 30 nm in thickness.

16. The method of claim 15, wherein the first conductive layer includes a bottom metal layer of no more than 300 nm in thickness.

* * * * *